United States Patent
Lee et al.

(10) Patent No.: US 11,362,224 B2
(45) Date of Patent: Jun. 14, 2022

(54) PHOTODETECTOR AND METHOD OF MANUFACTURING THE PHOTODETECTOR

(71) Applicant: RESEARCH & BUSINESS FOUNDATION SUNGKYUNKWAN UNIVERSITY, Suwon-si (KR)

(72) Inventors: Sung Joo Lee, Seongnam-si (KR); Jae Ho Jeon, Bucheon-si (KR); Seung Hyuk Choi, Seoul (KR); Jin Hong Park, Hwaseong-si (KR)

(73) Assignee: Research & Business Foundation Sungkyunkwan University, Suwon-si (KR)

(*) Notice: Subject to any disclaimer, the term of this patent is extended or adjusted under 35 U.S.C. 154(b) by 0 days.

(21) Appl. No.: 17/072,199

(22) Filed: Oct. 16, 2020

(65) Prior Publication Data

US 2021/0119070 A1    Apr. 22, 2021

(30) Foreign Application Priority Data

Oct. 18, 2019   (KR) .......................... 10-2019-0129496

(51) Int. Cl.
*H01L 31/0352*    (2006.01)
*H01L 31/108*    (2006.01)
*H01L 31/18*    (2006.01)

(52) U.S. Cl.
CPC .... *H01L 31/03529* (2013.01); *H01L 31/1085* (2013.01); *H01L 31/1864* (2013.01)

(58) Field of Classification Search
CPC ........... H01L 31/03529; H01L 31/1085; H01L 31/1864; H01L 31/036; H01L 31/032;

(Continued)

(56) References Cited

U.S. PATENT DOCUMENTS 2,765,385 A * 10/1956 Thomsen ................ H01L 21/00
  338/15
3,214,591 A * 10/1965 Hadley .................... G01D 5/26
  250/206

(Continued)

FOREIGN PATENT DOCUMENTS

| CN | 104300032 A | * | 1/2015 |
| JP | 2015-502658 A | | 1/2015 |
| KR | 10-2010-0032447 A | | 3/2010 |

OTHER PUBLICATIONS

Zhao, Zhenhuan, et al., "Vertically Aligned MoS2/Mo2C Hybrid Nanosheets Grown on Carbon Paper for Efficient Electrocatalytic Hydrogen Evolution," *ACS Catalysis*, 7, 10, 2017 (pp. 7312-7318).

(Continued)

*Primary Examiner* — Sitaramarao S Yechuri
(74) *Attorney, Agent, or Firm* — NSIP Law (57) ABSTRACT

Disclosed is a photodetector in which a plurality of conductive stripes spaced apart from each other are bonded onto a two-dimensional semiconductor thin-film, and a pitch between adjacent conductive stripes is controlled to selectively adjust a plasmonic resonance wavelength zone, such that the photodetector has a high absorbance and a wide detection zone at the same time. Further, a manufacturing method thereof is disclosed. The photodetector includes a semiconductor thin-film; and a plurality of conductive stripes bonded onto the semiconductor thin-film and extending in a parallel manner to each other and spaced apart from each other.

14 Claims, 10 Drawing Sheets

(58) Field of Classification Search
CPC .............. H01L 31/08; H01L 31/02002; H01L 31/02366; H01L 31/18; H01L 21/0274; Y02P 70/50
See application file for complete search history.

(56) References Cited

U.S. PATENT DOCUMENTS

2011/0156194 A1* 6/2011 Gravrand .......... H01L 31/02002
257/436
2012/0068049 A1 3/2012 Ogawa

OTHER PUBLICATIONS

Hantanasirisakul, Kanit et al., "Electronic and Optical Properties of 2D Transition Metal Carbides and Nitrides (MXenes)," *Advanced materials*, 30, 52, 2018 (pp. 1-30).

* cited by examiner

PHOTODETECTOR AND METHOD OF MANUFACTURING THE PHOTODETECTOR

CROSS-REFERENCE TO RELATED APPLICATION

This application claims a benefit under 35 U.S.C. § 119(a) of Korean Patent Application No. 10-2019-0129496 filed on Oct. 18, 2019, on the Korean Intellectual Property Office, the entire disclosure of which is incorporated herein by reference for all purposes.

BACKGROUND

1. Field

The present disclosure relates to a photodetector in which a plurality of conductive stripes spaced apart from each other are bonded onto a two-dimensional semiconductor thin-film, and a pitch between adjacent conductive stripes is controlled to selectively adjust a plasmonic resonance wavelength zone, such that the photodetector has a high absorbance and a wide detection zone at the same time, and relates to a manufacturing method thereof.

2. Description of Related Art

In general, a photodetector using a single 2D semiconductor material has low absorbance due to a small thickness of the 2D semiconductor material. Further, a wavelength zone that may be detected by the photodetector is limited depending on band gaps of 2D materials.

Further, a two-dimensional conductor is used to selectively control a plasmon resonance wavelength zone via structure control. However, it is difficult to freely control the resonance wavelength zone and freely control the structure.

In one example, $Mo_2C$ exhibits properties of a two-dimensional conductor. However, $Mo_2C$ may not be formed into a large area thin film, and thus may not be applied to actual electronic devices. Recently, approaches for synthesizing a $Mo_2C$ thin film on an interface of a copper (Cu) foil or a molybdenum (Mo) foil via a CVD process has been studied. However, in this approach, graphene rather than $Mo_2C$ may be synthesized due to a temperature difference of about 10° C. to 20° C. Thus, due to such an unstable process, the $Mo_2C$ thin film formation approach using the CVD process may not be practically utilized.

SUMMARY

This Summary is provided to introduce a selection of concepts in a simplified form that are further described below in the Detailed Description. This Summary is not intended to identify all key features or essential features of the claimed subject matter, nor is it intended to be used alone as an aid in determining the scope of the claimed subject matter.

One purpose of the present disclosure is to provide a photodetector with high absorbance and a wide detection zone at the same time.

Another purpose of the present disclosure is to provide a manufacturing method of the photodetector.

A first aspect of the present disclosure provides a photodetector comprising: a semiconductor thin-film; and a plurality of conductive stripes bonded onto the semiconductor thin-film and extending in a parallel manner to each other and spaced apart from each other.

In one implementation of the photodetector, the semiconductor thin-film includes molybdenum disulfide ($MoS_2$), molybdenum diselenide ($MoSe_2$), molybdenum ditelluride ($MoTe_2$), tungsten disulfide ($WS_2$), tungsten diselenide ($WSe_2$), tungsten ditelluride ($WTe_2$), etc., and each of the conductive stripes includes molybdenum carbide ($Mo_2C$) or tungsten carbide (WC).

In one implementation of the photodetector, pitches between adjacent ones of the conductive stripes are the same.

In one implementation of the photodetector, a surface of the semiconductor thin-film includes first and second regions adjacent to each other, wherein a pitch between adjacent ones of first conductive stripes disposed in the first region is different from a pitch of adjacent ones of second conductive stripes disposed in the second region.

In one implementation of the photodetector, a surface of the semiconductor thin-film includes first and second regions adjacent to each other, wherein a width of each of first conductive stripes disposed in the first region is different from a width of each of second conductive stripes disposed in the second region.

In one implementation of the photodetector, a region of a surface of the semiconductor thin-film not covered by the conductive stripes is exposed to detection target light to absorb the light, thereby to generate photocurrent.

In one implementation of the photodetector, the conductive stripes are exposed to detection target light to supply electrons generated via plasmon resonance to the semiconductor thin-film.

In one implementation of the photodetector, a Schottky barrier height between the semiconductor thin-film and the conductive stripes is in a range of 60 to 80 meV.

In one implementation of the photodetector, the conductive stripes are connected to each other at ends thereof.

A second aspect of the present disclosure provides a method for manufacturing a photodetector, the method comprising transferring and bonding a plurality of conductive stripes onto a semiconductor thin-film, wherein the plurality of conductive stripes extend in a parallel manner to each other and are spaced apart from each other.

In one implementation of the method, the semiconductor thin-film includes molybdenum disulfide ($MoS_2$), wherein each of the conductive stripes includes molybdenum carbide ($Mo_2C$).

In one implementation of the method, the method comprises forming the conductive stripes, wherein forming the conductive stripes includes: forming a plurality of conductive stripes in a semiconductor thin-film made of molybdenum disulfide ($MoS_2$), wherein the plurality of conductive stripes extend in a parallel manner to each other and are spaced apart from each other; and chemically converting the plurality of conductive stripes into molybdenum carbide ($Mo_2C$) by annealing the plurality of conductive stripes under presence of hydrogen ($H_2$) and methane ($CH_4$).

In one implementation of the method, chemically converting the plurality of conductive stripes includes: placing the semiconductor thin-film having the plurality of conductive stripes formed therein into a chamber; raising a temperature of the chamber to a first temperature while injecting argon (Ar) into the chamber; annealing the semiconductor thin-film having the plurality of conductive stripes formed therein for a first time while injecting hydrogen ($H_2$) gas and methane ($CH_4$) gas into the chamber; and cooling an inside of the chamber to room temperature.

In one implementation of the method, the first temperature is in a range of 700 to 1000° C., and the first time is in a range of 2 to 8 hours.

In one implementation of the method, forming the plurality of conductive stripes in the semiconductor thin-film includes: coating a photoresist film on the semiconductor thin-film made of molybdenum disulfide ($MoS_2$); patterning the photosensitive film using an electron beam lithography process; and plasma etching the semiconductor thin-film using the patterned photosensitive film to obtain the plurality of conductive stripes.

Effects in accordance with the present disclosure may be as follows but may not be limited thereto.

According to the present disclosure, the photodetector has the plurality of conductive stripes spaced apart from each other and bonded onto the two-dimensional semiconductor thin-film, and the pitch between adjacent conductive stripes may be controlled to selectively adjust a plasmonic resonance wavelength zone, such that the photodetector has a high absorbance and a wide detection zone at the same time.

Further, a hot carrier generated via a resonance phenomenon may be efficiently injected from the conductive stripes into the semiconductor thin-film using a low Schottky barrier property between the semiconductor and the conductor, thereby improving performance of the photodetector.

In addition to the effects as described above, specific effects in accordance with the present disclosure will be described together with the detailed description for carrying out the disclosure.

DETAILED DESCRIPTIONS

For simplicity and clarity of illustration, elements in the figures are not necessarily drawn to scale. The same reference numbers in different figures represent the same or similar elements, and as such perform similar functionality. Further, descriptions and details of well-known steps and elements are omitted for simplicity of the description. Furthermore, in the following detailed description of the present disclosure, numerous specific details are set forth in order to provide a thorough understanding of the present disclosure. However, it will be understood that the present disclosure may be practiced without these specific details. In other instances, well-known methods, procedures, components, and circuits have not been described in detail so as not to unnecessarily obscure aspects of the present disclosure.

Examples of various embodiments are illustrated and described further below. It will be understood that the description herein is not intended to limit the claims to the specific embodiments described. On the contrary, it is intended to cover alternatives, modifications, and equivalents as may be included within the spirit and scope of the present disclosure as defined by the appended claims.

The terminology used herein is for the purpose of describing particular embodiments only and is not intended to limit the present disclosure. As used herein, the singular forms "a" and "an" are intended to include the plural forms as well, unless the context clearly indicates otherwise. It will be further understood that the terms "comprises", "comprising", "includes", and "including" when used in this specification, specify the presence of the stated features, integers, operations, elements, and/or components, but do not preclude the presence or addition of one or more other features, integers, operations, elements, components, and/or portions thereof. As used herein, the term "and/or" includes any and all combinations of one or more of the associated listed items. Expression such as "at least one of" when preceding a list of elements may modify the entire list of elements and may not modify the individual elements of the list.

It will be understood that, although the terms "first", "second", "third", and so on may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

In addition, it will also be understood that when a first element or layer is referred to as being present "on" or "beneath" a second element or layer, the first element may be disposed directly on or beneath the second element or may be disposed indirectly on or beneath the second element with a third element or layer being disposed between the first and second elements or layers.

It will be understood that when an element or layer is referred to as being "connected to", or "coupled to" another element or layer, it may be directly on, connected to, or coupled to the other element or layer, or one or more intervening elements or layers may be present. In addition, it will also be understood that when an element or layer is referred to as being "between" two elements or layers, it may be the only element or layer between the two elements or layers, or one or more intervening elements or layers may also be present.

Further, as used herein, when a layer, film, region, plate, or the like is disposed "on" or "on a top" of another layer, film, region, plate, or the like, the former may directly contact the latter or still another layer, film, region, plate, or the like may be disposed between the former and the latter. As used herein, when a layer, film, region, plate, or the like is directly disposed "on" or "on a top" of another layer, film, region, plate, or the like, the former directly contacts the latter and still another layer, film, region, plate, or the like is not disposed between the former and the latter. Further, as used herein, when a layer, film, region, plate, or the like is disposed "below" or "under" another layer, film, region, plate, or the like, the former may directly contact the latter or still another layer, film, region, plate, or the like may be disposed between the former and the latter. As used herein, when a layer, film, region, plate, or the like is directly disposed "below" or "under" another layer, film, region, plate, or the like, the former directly contacts the latter and still another layer, film, region, plate, or the like is not disposed between the former and the latter.

Unless otherwise defined, all terms including technical and scientific terms used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 1:
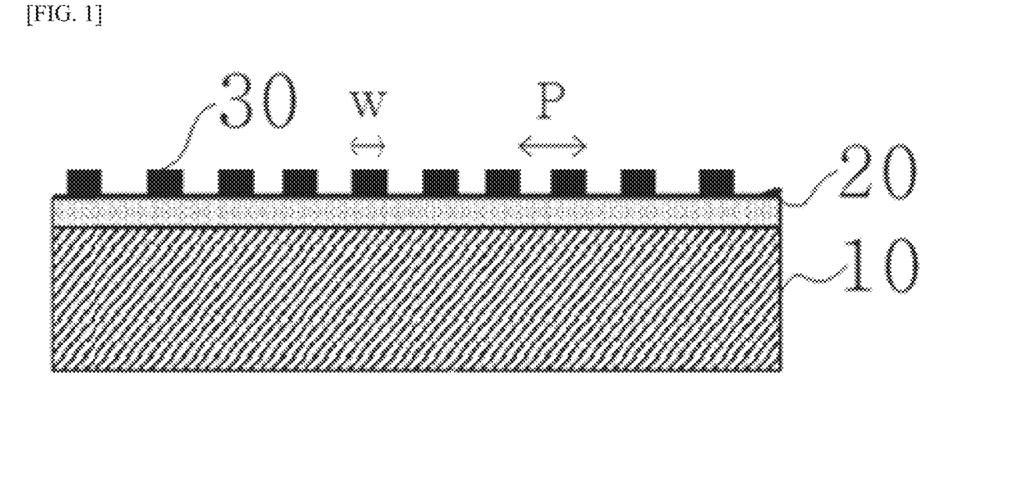
FIG. 1 is a diagram showing a photodetector according to an embodiment of the present disclosure.

FIG. 1 is a diagram showing a photodetector according to an embodiment of the present disclosure.

Referring to FIG. 1, a photodetector according to an embodiment of the present disclosure includes a semiconductor thin-film 20; and a plurality of conductive stripes 30 bonded onto the semiconductor thin-film 20 and spaced apart from each other.

The semiconductor thin-film 20 is a two-dimensional thin film having a nanoscale thickness, and may be made of molybdenum disulfide ($MoS_2$), molybdenum diselenide ($MoSe_2$), molybdenum ditelluride ($MoTe_2$), tungsten disulfide ($WS_2$), tungsten diselenide ($WSe_2$), tungsten ditelluride ($WTe_2$), etc.

In one example embodiment, the semiconductor thin-film 20 may be grown using chemical vapor deposition (CVD), but the present disclosure is not limited thereto. In another example embodiment, the semiconductor thin-film 20 may be formed by peeling a bulky source material.

The plurality of conductive stripes 30 are bonded onto the semiconductor thin-film 20, are spaced apart from each other. The plurality of conductive stripes 30 may preferably be made of molybdenum carbide ($Mo_2C$) or tungsten carbide (WC).

Figure 3:
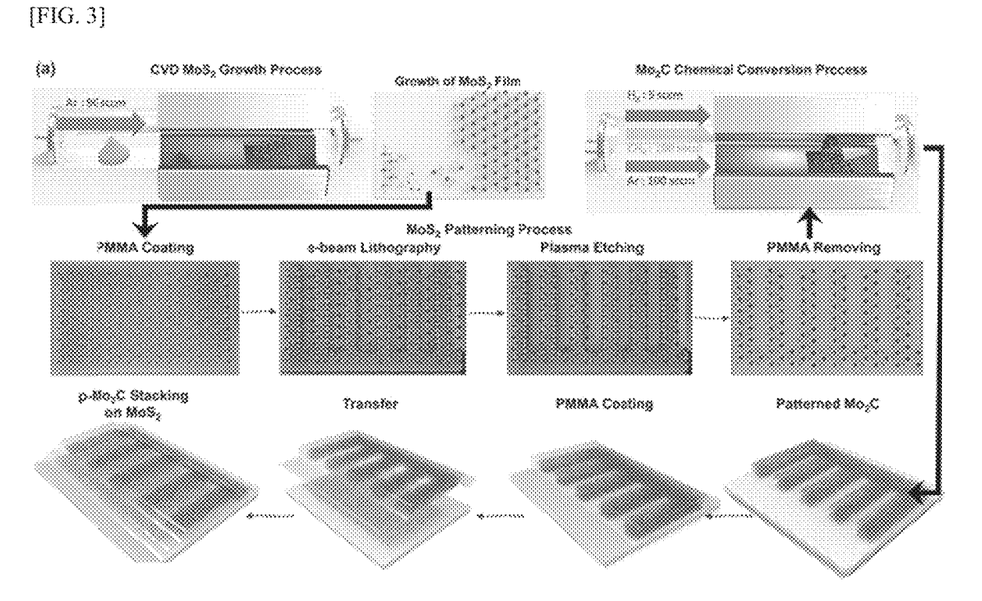
FIG. 3 is a schematic diagram of a photodetector manufacturing method according to an embodiment of the present disclosure.

In another embodiment, the conductive stripes may have a lattice structure in which the conductive stripes may be connected to each other at ends thereof as shown in a in FIG. 3.

A wavelength zone in which plasmon resonance occurs may vary based on a pitch between adjacent conductive stripes 30. Thus, the pitch between adjacent conductive stripes 30 may act as an important factor in the present disclosure.

In this connection, the pitch between adjacent conductive stripes 30 may be in a range of a nanometer scale to a micro scale depending on limitations in terms of lithography.

In one embodiment, the conductive stripes 30 may have the same pitch, and thus the photodetector according to the present disclosure may include the conductive stripes 30 having a single pitch.

In another embodiment, a surface of the semiconductor thin-film 20 may include first and second regions adjacent to each other. A pitch between adjacent ones of first conductive stripes disposed in the first region may be different from a pitch of adjacent ones of second conductive stripes disposed in the second region.

In another embodiment, a surface of the semiconductor thin-film 20 includes first and second regions adjacent to each other. A width of each of first conductive stripes disposed in the first region may be different from a width of each of second conductive stripes disposed in the second region.

That is, in the photodetector according to the present disclosure is, the pitch between adjacent ones of the first conductive stripes disposed in the first region and the pitch between adjacent ones of the second conductive stripes disposed in the second region may be equal to each other, while the width of each of the first conductive stripes disposed in the first region and the width of each of the second conductive stripes disposed in the second region may be different from each other. In this way, a wavelength zone in which plasmon resonance occurs may be selectively controlled.

Conversely, in the photodetector according to the present disclosure is, the pitch between adjacent ones of the first conductive stripes disposed in the first region and the pitch between adjacent ones of the second conductive stripes disposed in the second region may be different from each other, while the width of each of the first conductive stripes disposed in the first region and the width of each of the second conductive stripes disposed in the second region may be equal to each other. In this way, a wavelength zone in which plasmon resonance occurs may be selectively controlled.

That is, in the photodetector according to the present disclosure, the plurality of conductive stripes 30 spaced apart from each other are bonded onto the two-dimensional semiconductor thin-film 20, and the pitch between adjacent conductive stripes 30 may be controlled such that the wavelength zone where plasmon resonance occurs may be selectively controlled.

Further, a Schottky barrier height between the semiconductor thin-film and the conductive stripes may be in a range of 60 to 80 meV. Therefore, a hot carrier generated via the resonance phenomenon may be efficiently injected from the conductive stripes 30 to the semiconductor thin-film 20 using the low Schottky barrier characteristics between the semiconductor and the conductor, thereby improving performance of the photodetector.

Specifically, when the pitch between the adjacent conductive stripes 30 varies, the photodetector according to the present disclosure may detect a wavelength band from a visible light region to an infrared region In this connection, a region of the surface of the semiconductor thin-film 20 not covered with the conductive stripes may be exposed to detection target light to absorb the light, thereby to generate photocurrent.

Further, the conductive stripes 30 are exposed to the detection target light to supply hot electrons generated via the plasmon resonance to the semiconductor thin-film 20. Due to the low Schottky barrier between the semiconductor and the conductor and a close-contact bonding structure, more efficient transfer of the electrons may be realized than when transferred from a general metal to a two-dimensional semiconductor, thereby increasing generation of photocurrent.

Therefore, controlling the pitch between adjacent conductive stripes 30 may allow the photodetector according to the present disclosure to selectively control the wavelength zone where plasmon resonance occurs. When the photodetector is exposed to the detection target light, a region of the surface of the semiconductor thin-film 20 not covered with the conductive stripes may be exposed to the detection target light to absorb the light, thereby to generate the photocurrent. Further, the conductive stripes 30 are exposed to the detection target light to supply the hot electrons generated via the plasmon resonance to the semiconductor thin-film 20, thereby to generate photocurrent. Thus, a total amount of the photocurrent increases to improve the performance of the photodetector.

FIG. 3 is a schematic diagram of a photodetector manufacturing method according to an embodiment of the present disclosure.

Referring to FIG. 3, a photodetector manufacturing method to achieve another purpose of the present disclosure includes transferring and bonding the plurality of conductive stripes spaced apart from each other onto the semiconductor thin-film.

In this connection, the semiconductor thin-film may include molybdenum disulfide ($MoS_2$), and the conductive stripes may include molybdenum carbide ($Mo_2C$).

In one embodiment, forming the conductive stripes may include forming a lattice structure in which a plurality of conductive stripes are spaced apart from each other in a semiconductor thin-film made of molybdenum disulfide ($MoS_2$), and chemically converting the plurality of conductive stripes into molybdenum carbide ($Mo_2C$) by annealing the lattice structure under presence of hydrogen ($H_2$) and methane ($CH_4$).

First, a step of forming the lattice structure in which the plurality of conductive stripes are spaced apart from each other on the semiconductor thin-film made of molybdenum disulfide ($MoS_2$) is performed. The semiconductor thin-film made of molybdenum disulfide ($MoS_2$) is a two-dimensional thin film having a nanoscale thickness, and may be formed via growth using chemical vapor deposition (CVD). However, the present disclosure is not limited thereto. The semiconductor thin-film 20 may be formed by peeling a bulky molybdenum disulfide ($MoS_2$).

Specifically, the forming of the lattice structure may include coating a photosensitive film on the semiconductor thin-film made of molybdenum disulfide ($MoS_2$); patterning the photosensitive film using an electron beam lithography process; and plasma-etching the semiconductor thin-film.

In one embodiment, the semiconductor thin-film made of molybdenum disulfide ($MoS_2$) may be grown in a large area of 1.2 cm×1.2 cm using the chemical vapor deposition. Then, the photoresist (PMMA) may be coated on the semiconductor thin-film. Then, the photoresist layer may be patterned using an electron beam lithography process. Then, the semiconductor thin-film may be plasma etched to form the lattice structure in which the plurality of conductive stripes are spaced apart from each other.

In this connection, the pitch between adjacent conductive stripes 30 may be in a range of a nanometer scale to a micro scale depending on limitations in terms of lithography.

In one embodiment, the conductive stripes 30 may have the same pitch, and thus the photodetector according to the present disclosure may include the conductive stripes 30 having a single pitch.

In another embodiment, a surface of the semiconductor thin-film 20 may include first and second regions adjacent to each other. A pitch between adjacent ones of first conductive stripes disposed in the first region may be different from a pitch of adjacent ones of second conductive stripes disposed in the second region.

In another embodiment, a surface of the semiconductor thin-film 20 includes first and second regions adjacent to each other. A width of each of first conductive stripes disposed in the first region may be different from a width of each of second conductive stripes disposed in the second region.

That is, in the photodetector according to the present disclosure is, the pitch between adjacent ones of the first conductive stripes disposed in the first region and the pitch between adjacent ones of the second conductive stripes disposed in the second region may be equal to each other, while the width of each of the first conductive stripes disposed in the first region and the width of each of the second conductive stripes disposed in the second region may be different from each other. In this way, a wavelength zone in which plasmon resonance occurs may be selectively controlled.

Conversely, in the photodetector according to the present disclosure is, the pitch between adjacent ones of the first conductive stripes disposed in the first region and the pitch between adjacent ones of the second conductive stripes disposed in the second region may be different from each other, while the width of each of the first conductive stripes disposed in the first region and the width of each of the second conductive stripes disposed in the second region may be equal to each other. In this way, a wavelength zone in which plasmon resonance occurs may be selectively controlled.

That is, in the photodetector according to the present disclosure, the plurality of conductive stripes 30 spaced apart from each other are bonded onto the two-dimensional semiconductor thin-film 20, and the pitch between adjacent conductive stripes 30 may be controlled such that the wavelength zone where plasmon resonance occurs may be selectively controlled.

Next, the method includes chemically converting the plurality of conductive stripes into molybdenum carbide ($Mo_2C$) by annealing the lattice structure under presence of hydrogen ($H_2$) and methane ($CH_4$).

The chemical conversion of molybdenum disulfide ($MoS_2$) to the molybdenum carbide ($Mo_2C$) may be performed by thermally annealing the lattice structure for a preset time under presence of hydrogen ($H_2$) and methane ($CH_4$). In this case, hydrogen radical (H.) and methyl radical ($CH_3$.) may be generated via decomposition of hydrogen ($H_2$) and methane ($CH_4$) during the annealing process. Subsequently, the hydrogen radical (H.) allows a sulfur S atom in the lattice structure made of the molybdenum disulfide ($MoS_2$) to be reduced to hydrogen sulfide ($H_2S$) such that the sulfur atom is removed from the lattice structure. Carbonization reaction using the methyl radical ($CH_3$.) may occur at a site where the sulfur S atom is removed therefrom. As a result, molybdenum disulfide (MoS$_2$) of the lattice structure may be converted to the molybdenum carbide (Mo$_2$C).

Specifically, the chemical conversion process of molybdenum disulfide (MoS$_2$) to molybdenum carbide (Mo$_2$C) may be performed in a low pressure CVD chamber.

For example, after placing the semiconductor thin-film on which the lattice structure is formed in a CVD chamber in a vacuum state of about 0.2 mTorr or lower, the chamber is heated to a first temperature while argon (Ar) is injected thereto. Then, the lattice structure is annealed for a first time while injecting hydrogen (H$_2$) and methane (CH$_4$) into the chamber. Thus, the chemical conversion of molybdenum disulfide (MoS$_2$) of the lattice structure to molybdenum carbide (Mo$_2$C) may be achieved. When hydrogen (H$_2$) and methane (CH$_4$) are injected to the chamber after reaching a reaction temperature, chemical decomposition of the molybdenum disulfide (MoS$_2$) that occurs while increasing the temperature may be minimized.

In this case, in the annealing process, the first temperature may be about 700 to 1000° C., and the first time may be about 2 to 8 hours.

It was identified based on an experiment performed by the present inventors that the chemical conversion of molybdenum disulfide (MoS$_2$) to molybdenum carbide (Mo$_2$C) did not occur randomly in any region of the semiconductor thin-film but first occurred at an edge of the lattice structure in an energetically unstable state and then moved to a center thereof.

Therefore, in order to chemically convert an entirety of the lattice structure to molybdenum carbide (Mo$_2$C), a total annealing time may be preferably 4 hours or larger.

Further, in order to reduce the annealing temperature, a copper foil (Cu foil) as a catalyst for the formation reaction of hydrogen radical (H.) and methyl radical (CH$_3$) may be placed in the CVD chamber such that the copper foil is positioned over the lattice structure.

Hydrodesulfurization by hydrogen (H$_2$) in the molybdenum disulfide (MoS$_2$) is an endothermic reaction ($\Delta E > 1.4$ eV), and does not occur at temperatures below 800° C. even under the presence of hydrogen (H$_2$) and methane (CH$_4$). However, when decomposing hydrogen (H$_2$) and methane (CH$_4$) using the copper catalyst to form hydrogen radical (H.) and methyl radical (CH$_3$.) and then the hydrodesulfurization in the molybdenum disulfide (MoS$_2$) is induced using the hydrogen radical (H.), the hydrodesulfurization reaction by the hydrogen radical (H.) is an exothermic reaction and thus may easily occur even at low temperatures.

In this way, the plurality of conductive stripes separated from each other and made of molybdenum carbide (Mo$_2$C) may be formed. Then, the method may include transferring and bonding the plurality of conductive stripes onto the semiconductor thin-film. Thus, the photodetector according to the present disclosure may be manufactured.

Hereinafter, various Examples and Experimental Examples according to the present disclosure will be described in detail. However, the following Examples are merely some embodiments of the present disclosure, and the present disclosure should not be construed as being limited to the following Examples.

PRESENT EXAMPLES

Four photodetectors (Present Examples 1a to 1d) were manufactured in which pitches between the conductive stripes were respectively 400 nm, 600 nm, 800 nm and 1000 nm.

Figure 2A:
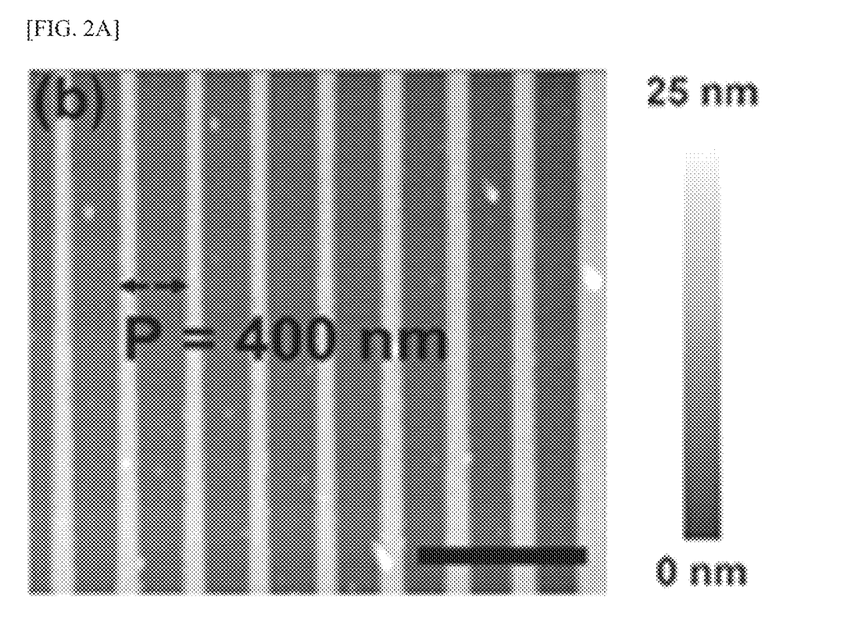
FIGS. 2A to 2D are atomic force microscope images of four photodetectors according to Examples of the present disclosure, respectively.
Figure 2B:
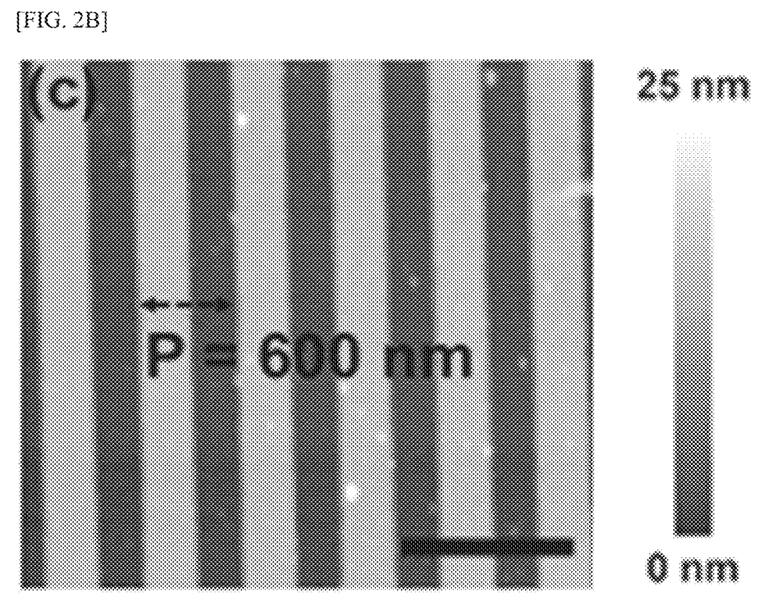
Figure 2C:
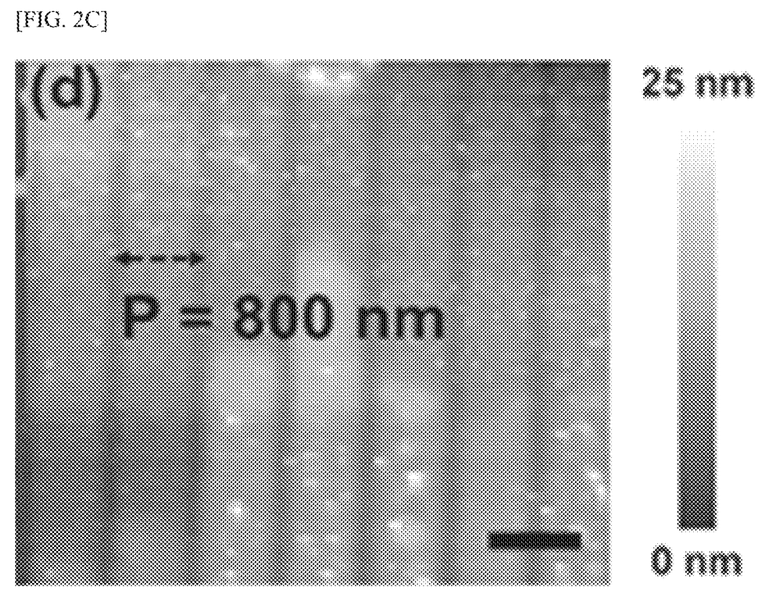
Figure 2D:
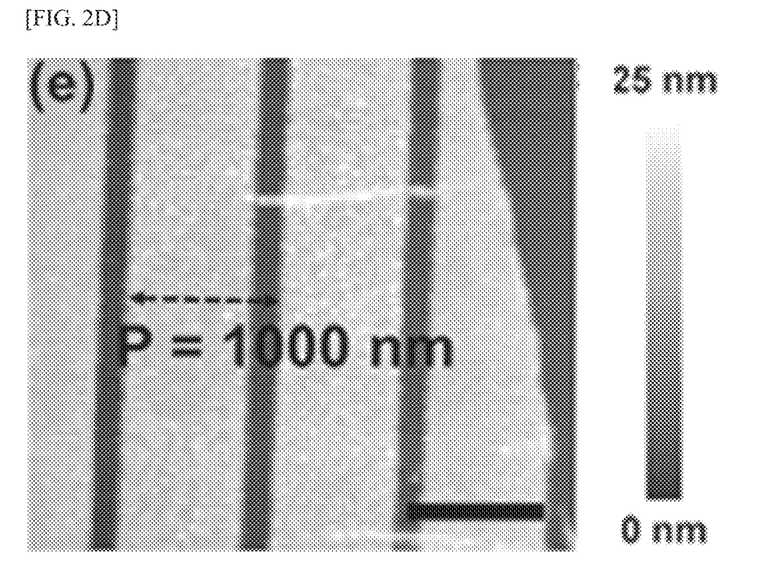
Figure 2E:
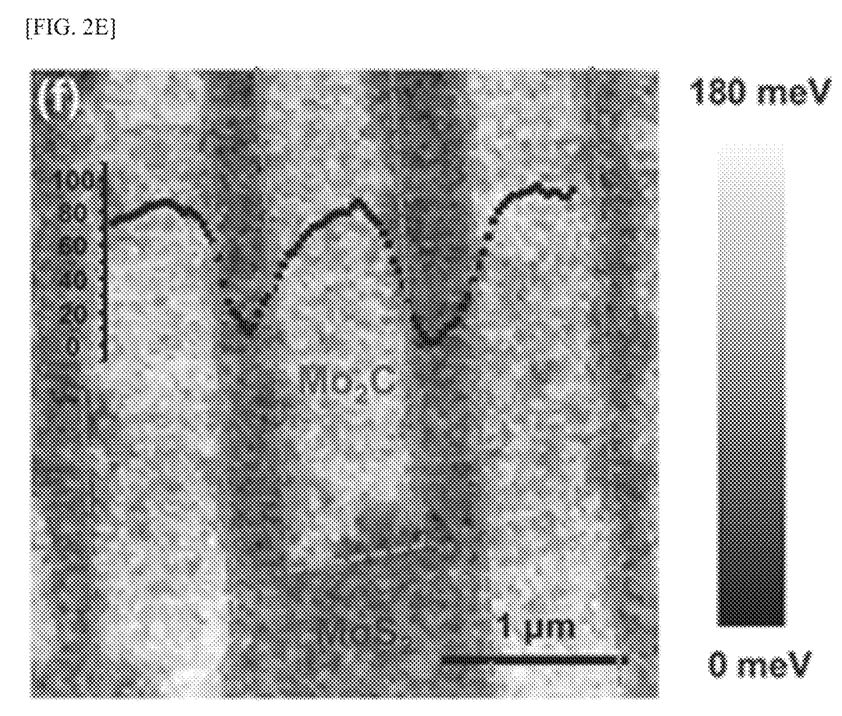
FIG. 2E is an image of a work function measurement via an atomic force microscope of a photodetector according to Example of the present disclosure.
Figure 2F:
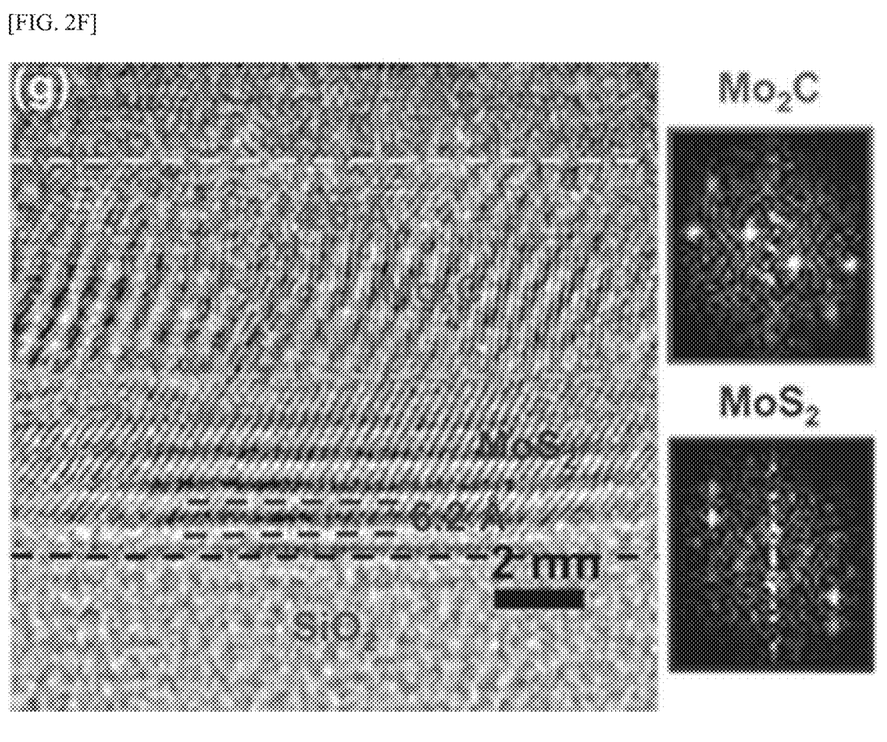
FIG. 2F is an electron transmission microscope image of and an FFT pattern image of a region of interest of a photodetector according to Example of the present disclosure.

FIGS. 2A to 2D are atomic force microscope images of four photodetectors according to Examples of the present disclosure, respectively, FIG. 2E is an image of a work function measurement via an atomic force microscope of a photodetector according to Example of the present disclosure, and FIG. 2F is an electron transmission microscope image of and an FFT pattern image of a region of interest of a photodetector according to Example of the present disclosure.

Referring to FIGS. 2A to 2D, it may be seen that the pitches between adjacent conductive stripes of Present Examples are 400 nm, 600 nm, 800 nm and 1000 nm, respectively.

Further, as shown in FIG. 2E, a difference between work functions of the semiconductor thin-film and the conductive stripes of the photodetector according to Present Example is measured as 70 meV, thus indicating a low Schottky barrier bonding characteristic.

Further, referring to FIG. 2F, it may be seen that the conductive stripes are transferred and bonded onto the semiconductor thin-film in a close contact manner at an atomic level.

Figure 4A:
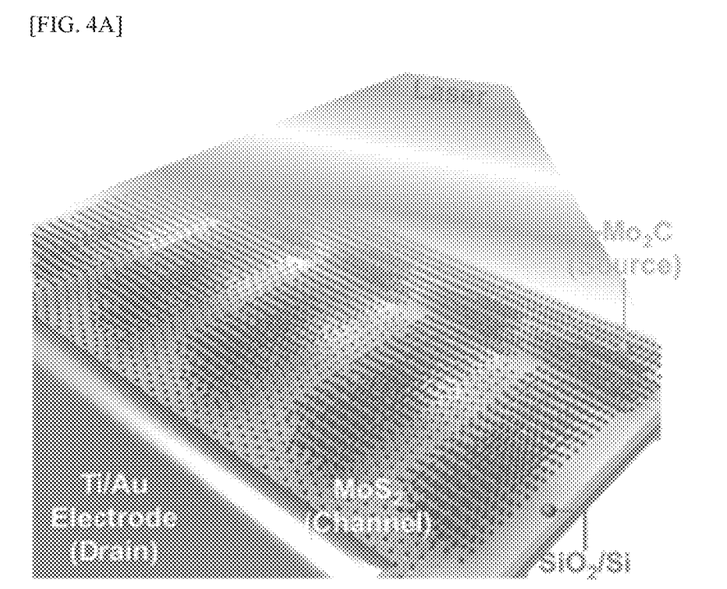
FIG. 4A is a diagram showing a photodetector including conductive stripes with the same pitch.

Evaluation Example 1: Photodetector Characteristics Including Conductive Stripes with Single Pitch A photodetector including conductive stripes with a single pitch of 1000 nm (Present Example 1d, FIG. 4A) was exposed to light in a wavelength region of 400 nm to 1400 nm. A current before exposing the same to the light was measured. A current after exposing the same to the light based on the incident light wavelength was measured. The results are shown in FIG. 4B.

Figure 4B:
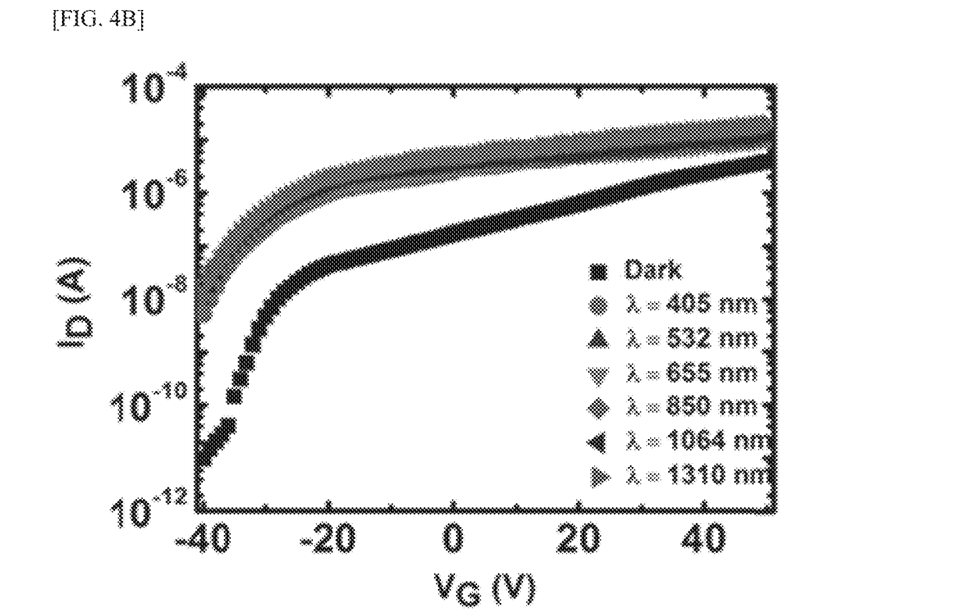
FIG. 4B is a diagram showing a result of measuring current before exposure of the photodetector of FIG. 4A to light and a current based on a wavelength of incident light.

Referring to FIG. 4B, it may be seen based on a comparing result between the current before exposure of the photodetector to the light and the current after exposure of the photodetector to the light, the current increases in an entire wavelength region when the photodetector is exposed to the light. Thus, Present Example 1d responds to the entire wavelength region.

Further, the photodetectors (Present Examples 1a and 1d) including conductive stripes having single pitches of 400 nm and 1000 nm, respectively, and a photodetector (Comparative Example) made of a single two-dimensional semiconductor were exposed to light in a wavelength region of 400 nm to 1400 nm. Then, the photocurrents thereof were measured based on the incident light wavelength. The results are shown in FIG. 4C.

Figure 4C:
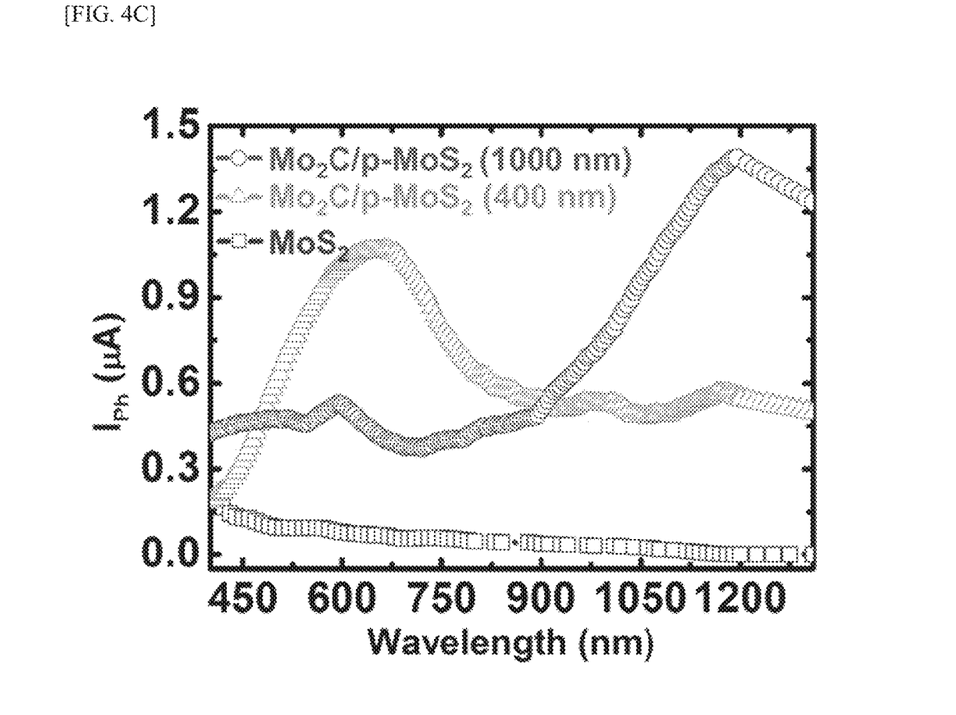
FIG. 4C is a diagram showing a result of measuring photocurrent based on the wavelength of incident light after exposure of photodetectors of Present Example and Comparative Example to light.

As shown in FIG. 4C, in the photodetector made of the single two-dimensional semiconductor, the photocurrent was measured to be relatively low in an entire wavelength region. A wavelength zones in which the photocurrent was the highest in Present Examples 1a and 1d were different from each other.

Figure 4D:
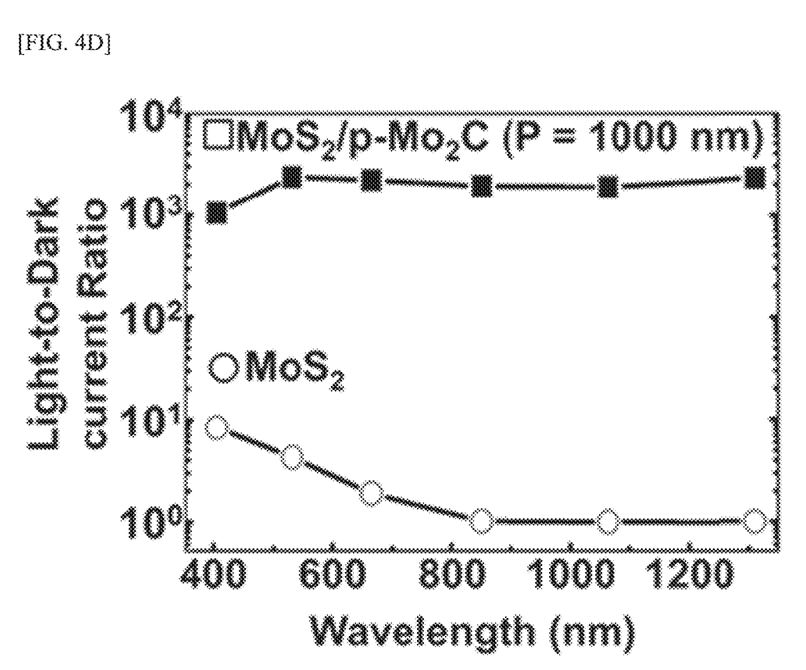
FIG. 4D is a diagram showing a ratio between photocurrent and dark current of each of photodetectors of Present Example and Comparative Example based on a wavelength of incident light incident thereto.

Further, FIG. 4D is a diagram showing a ratio (LtDR) between photocurrent and dark current of each of photodetectors of Present Example 1d and Comparative Example based on a wavelength of incident light incident thereto. In Comparative Example, the photocurrent was generated only in a wavelength region in which a wavelength of the light incident thereto has energy higher than a band gap of the 2D semiconductor, and thus the LtDR value was present only in a specific wavelength region.

To the contrary, in Present Example 1d including the plurality of conductive stripes, a high LtDR value was exhibited in a wide wavelength region of 400 to 1400 nm.

Thus, the photodetector according to Present Example of the present disclosure is considered to be capable of detecting the wide wavelength region.

Figure 5:
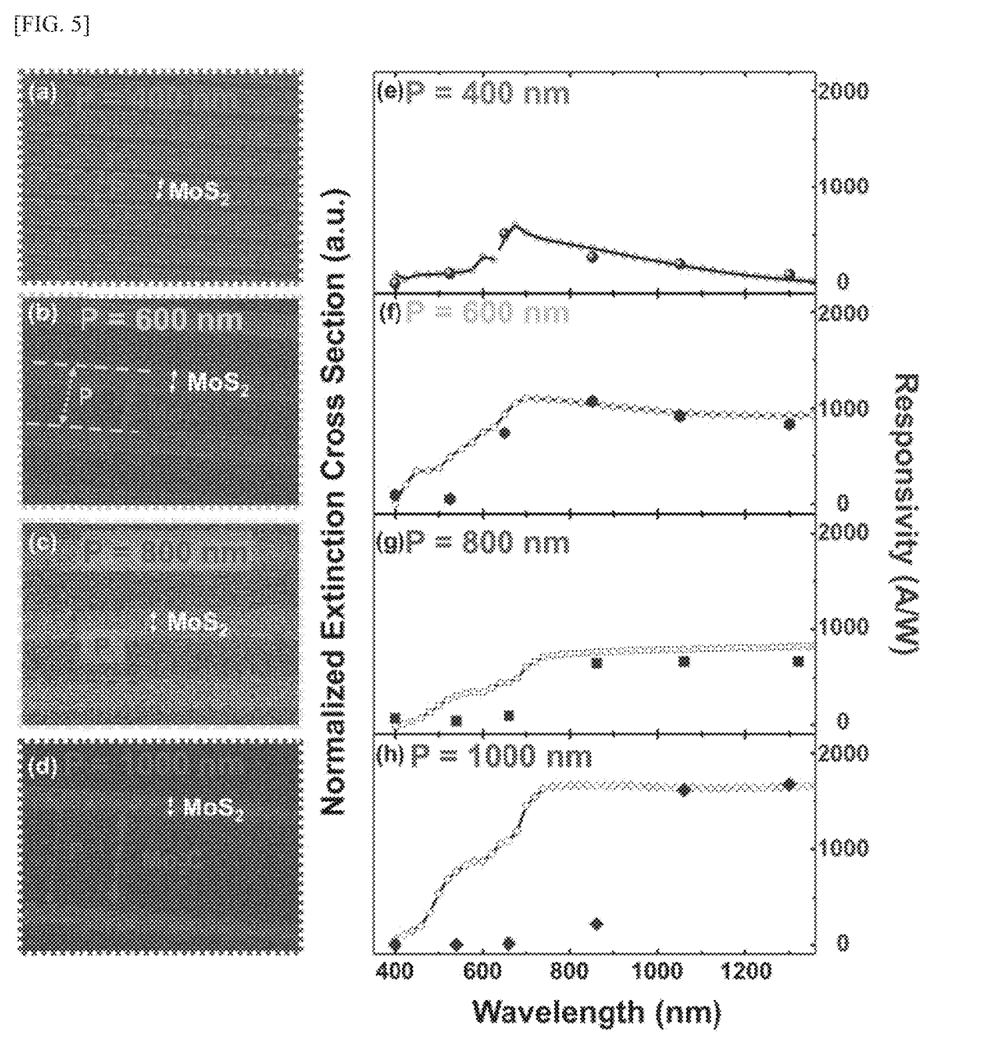
FIG. 5 is a drawing illustrating scanning electron microscope images ((a) to (d)) of photodetectors of Present Examples, and graphs ((e) to (h)) showing simulation of a plasmonic resonance zone and a responsivity based on incident light wavelength for photodetectors of Present Examples.

Evaluation Example 2: Simulation of Plasmon Resonance Wavelength Zone Based on Pitch of Conductive Stripes (a) to (d) in FIG. 5 are scanning electron microscope images of photodetectors of Present Examples 1a to 1d. (e) to (h) in FIG. 5 are graphs showing simulation of a plasmonic resonance zone and a responsivity based on incident light wavelength for photodetectors of Present Examples 1a to 1d.

A bonding structure between the semiconductor thin-film and the conductive stripes may be identified via (a) to (d) FIG. 5.

Further, referring to (e) to (h) in FIG. 5, it may be seen that the plasmonic resonance is stronger in a larger wavelength zone as the pitch between adjacent conductive stripes increases. It is identified that the photodetector according to the present disclosure exhibits higher photo-responsivity in a larger wavelength region as the pitch between adjacent conductive stripes increases.

Evaluation Example 3: Characteristics of Photodetector Including Conductive Stripes Having Combination of Various Pitches The semiconductor thin-film surface includes first and second regions adjacent to each other. The pitch and/or width of the first conductive stripes disposed in the first region, and the pitch and/or width of the second conductive stripes disposed in the second region are different from each other. Thus, a photodetector present (Present Example 1e) including conductive stripes having combination of various pitches is manufactured.

Figure 6A:
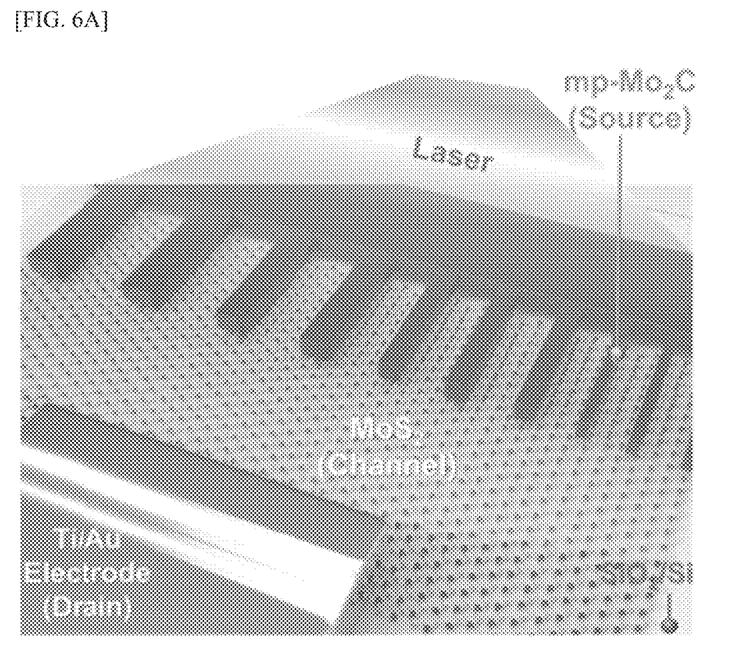
FIG. 6A is a diagram showing a photodetector including conductive stripes with a combination of various pitches.
Figure 6B:
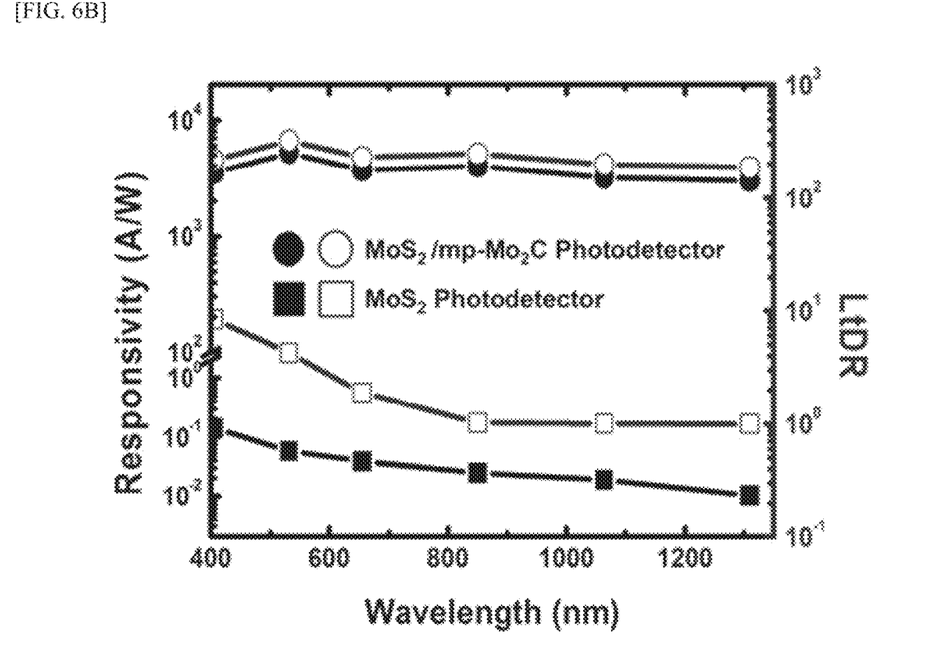
FIG. 6B is a graph showing a ratio (LtDR) between photocurrent and dark current, and a responsivity based on incident light wavelength for photodetectors of Present Example and Comparative Example.

FIG. 6A is a diagram showing a photodetector including conductive strips with a combination of various pitches. FIG. 6B is a graph showing a ratio (LtDR) between photocurrent and dark current, and a responsivity based on incident light wavelength for photodetectors of Present Example 1e and Comparative Example.

Referring to FIG. 6B, it may be seen that Present Example 1e has higher photo-responsivity and LtDR values in a wider wavelength zone, compared to the Comparative Example.

Figure 6C:
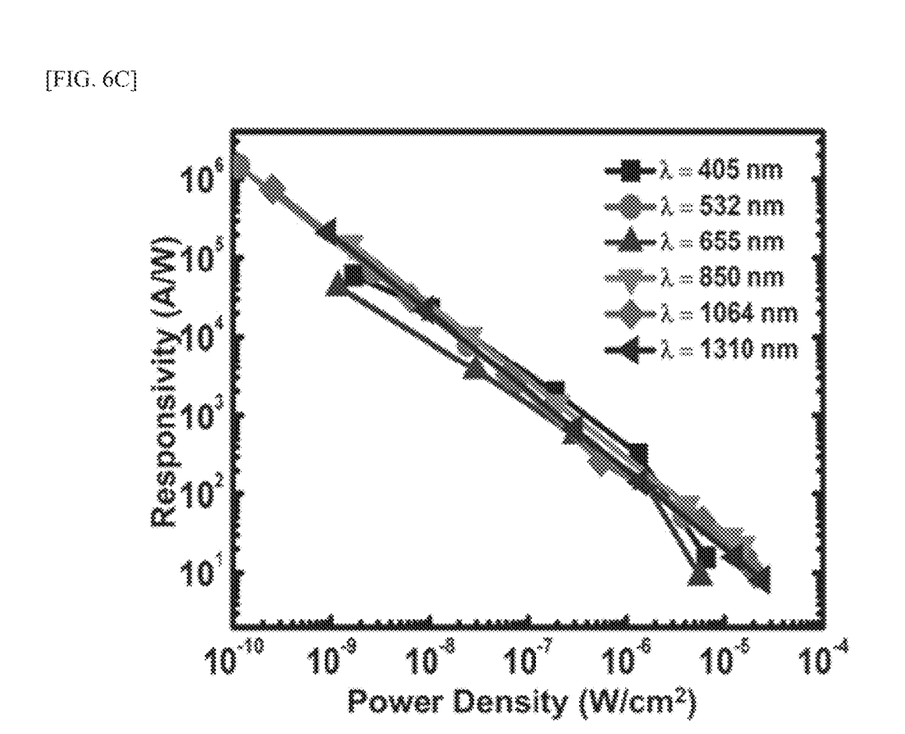
FIG. 6C is a graph showing a responsivity based on a power density of incident light for photodetectors of Present Example and Comparative Example.

FIG. 6C is a graph showing a responsivity based on a power density of incident light for photodetectors of Present Example 1e and Comparative Example.

As shown in FIG. 6C, the power density and the responsivity are proportional to each other in the same degree regardless of the incident wavelength in both the Present Example 1e and the Comparative Example. This indicates that the photodetector according to the present disclosure has the same responsivity in an entire wavelength range.

As described above, the present disclosure is described with reference to the drawings. However, the present disclosure is not limited to the embodiments and drawings disclosed in the present specification. It will be apparent that various modifications may be made thereto by those skilled in the art within the scope of the present disclosure. Furthermore, although the effect resulting from the features of the present disclosure has not been explicitly described in the description of the embodiments of the present disclosure, it is obvious that a predictable effect resulting from the features of the present disclosure should be recognized.

What is claimed is:

1. A photodetector comprising:
a semiconductor thin-film; and
a plurality of conductive stripes bonded onto the semiconductor thin-film and extending in a parallel manner to each other and spaced apart from each other,
wherein the semiconductor thin-film comprises at least one of the group consisting of molybdenum disulfide ($MoS_2$), molybdenum diselenide ($MoSe_2$), molybdenum ditelluride ($MoTe_2$), tungsten disulfide ($WS_2$), tungsten diselenide ($WSe_2$), and tungsten ditelluride ($WTe_2$), and
wherein each of the conductive stripes comprises molybdenum carbide ($Mo_2C$) or tungsten carbide (WC).

2. The photodetector of claim 1, wherein pitches between adjacent ones of the conductive stripes are the same.

3. The photodetector of claim 1, wherein a surface of the semiconductor thin-film includes first and second regions adjacent to each other, and
wherein a pitch between adjacent ones of first conductive stripes disposed in the first region is different from a pitch of adjacent ones of second conductive stripes disposed in the second region.

4. The photodetector of claim 1, wherein a surface of the semiconductor thin-film includes first and second regions adjacent to each other,
wherein a width of each of first conductive stripes disposed in the first region is different from a width of each of second conductive stripes disposed in the second region.

5. The photodetector of claim 1, wherein a region of a surface of the semiconductor thin-film not covered by the conductive stripes is exposed to detection target light to absorb the light, thereby to generate photocurrent.

6. The photodetector of claim 1, wherein the conductive stripes are exposed to detection target light to supply electrons generated via plasmon resonance to the semiconductor thin-film.

7. The photodetector of claim 1, wherein a Schottky barrier height between the semiconductor thin-film and the conductive stripes is in a range of 60 to 80 meV.

8. The photodetector of claim 1, wherein the conductive stripes are connected to each other at ends thereof.

9. A method for manufacturing a photodetector, the method comprising:
transferring and bonding a plurality of conductive stripes onto a semiconductor thin-film including molybdenum disulfide ($MoS_2$),
wherein the plurality of conductive stripes extend in a parallel manner to each other and are spaced apart from each other, and each conductive stripe includes molybdenum carbide ($Mo_2C$).

10. The method of claim 9, wherein the method further comprises:
forming the plurality of conductive stripes on the semiconductor thin-film made of molybdenum disulfide ($MoS_2$), wherein the plurality of conductive stripes extend in a parallel manner to each other and are spaced apart from each other; and
chemically converting the plurality of conductive stripes into the molybdenum carbide ($Mo_2C$) by annealing the plurality of conductive stripes under presence of hydrogen ($H_2$) and methane ($CH_4$).

11. The method of claim 10, wherein the chemically converting of the plurality of conductive stripes includes:
placing the semiconductor thin-film having the plurality of conductive stripes formed therein into a chamber;

raising a temperature of the chamber to a first temperature while injecting argon (Ar) into the chamber;

annealing the semiconductor thin-film having the plurality of conductive stripes formed therein for a first time while injecting hydrogen ($H_2$) gas and methane ($CH_4$) gas into the chamber; and cooling an inside of the chamber to room temperature.

12. The method of claim 11, wherein the first temperature is in a range of 700 to 1000° C., and the first time is in a range of 2 to 8 hours.

13. The method of claim 10, wherein the forming of the plurality of conductive stripes in the semiconductor thin-film includes:

coating a photoresist film on the semiconductor thin-film made of molybdenum disulfide ($MoS_2$);

patterning the photoresist film using an electron beam lithography process; and plasma etching the semiconductor thin-film using the patterned photoresist film to obtain the plurality of conductive stripes.

14. A photodetector comprising:

a semiconductor thin-film; and a plurality of conductive stripes bonded onto the semiconductor thin-film and extending in a parallel manner to each other and spaced apart from each other, wherein a Schottky barrier height between the semiconductor thin-film and the conductive stripes is in a range of 60 to 80 meV.

\* \* \* \* \*